United States Patent
Li et al.

(10) Patent No.: US 9,098,410 B2
(45) Date of Patent: Aug. 4, 2015

(54) CROSS-DECODING FOR NON-VOLATILE STORAGE

(71) Applicant: Seagate Technology LLC, Cupertino, CA (US)

(72) Inventors: Yan Li, San Jose, CA (US); Hao Zhong, Milpitas, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/267,814

(22) Filed: May 1, 2014

(65) Prior Publication Data

US 2014/0331096 A1   Nov. 6, 2014

Related U.S. Application Data

(63) Continuation of application No. 13/323,769, filed on Dec. 12, 2011, now Pat. No. 8,719,663.

(60) Provisional application No. 61/422,198, filed on Dec. 12, 2010.

(51) Int. Cl.
| | |
|---|---|
| *G06F 11/00* | (2006.01) |
| *G06F 11/07* | (2006.01) |
| *G06F 11/10* | (2006.01) |
| *H03M 13/29* | (2006.01) |
| *G06F 12/02* | (2006.01) |
| *H03M 13/11* | (2006.01) |

(52) U.S. Cl.
CPC .......... *G06F 11/076* (2013.01); *G06F 11/1072* (2013.01); *G06F 12/0246* (2013.01); *H03M 13/2957* (2013.01); *G06F 2212/7202* (2013.01); *H03M 13/1102* (2013.01)

(58) Field of Classification Search
CPC . G06F 11/076; G06F 11/072; G06F 12/0246; G06F 2212/7202
USPC ........... 711/103; 370/342; 714/708, 763, 764, 714/773, 704
See application file for complete search history.

(56) References Cited

U.S. PATENT DOCUMENTS

| | | | | |
|---|---|---|---|---|
| 6,735,726 | B2 * | 5/2004 | Muranaka et al. | 714/708 |
| 8,001,441 | B2 * | 8/2011 | Brandman | 714/763 |
| 8,694,715 | B2 * | 4/2014 | Weingarten et al. | 711/103 |
| 2009/0003302 | A1 * | 1/2009 | Klein et al. | 370/342 |
| 2012/0066441 | A1 * | 3/2012 | Weingarten | 711/103 |
| 2012/0079351 | A1 * | 3/2012 | Cideciyan et al. | 714/764 |

* cited by examiner

*Primary Examiner* — David Ton
(74) *Attorney, Agent, or Firm* — Taylor English Duma LLP

(57) ABSTRACT

Cross-decoding assists decoding of an otherwise uncorrectable error when decoding a desired page of a multi-level-cell technology flash memory. A solid-state disk (SSD) controller adjusts space allocated to redundancy respectively within various pages (e.g. upper, middle, and lower pages) such that the respective pages have respective effective Bit Error Rates (BER)s, optionally including cross-decoding, that approach one another. Alternatively the controller adjusts the allocation to equalize decoding time (or alternatively access time), optionally including decoding time (accessing time) accrued as a result of cross-decoding when there is an otherwise uncorrectable error. The adjusting is via (a) respective ratios between allocation for ECC redundancy and user data space, and/or (b) respective coding rates and/or coding techniques for each of the various pages. Alternatively the controller adjusts the allocation to maximize total usable capacity by allocating to redundancy and data for the various pages, assuming that cross-decoding is to be used.

20 Claims, 5 Drawing Sheets

CROSS-DECODING FOR NON-VOLATILE STORAGE

CROSS REFERENCE TO RELATED APPLICATIONS

Priority benefit claims for this application are made in the accompanying Application Data Sheet. To the extent permitted by the type of the instant application, this application incorporates by reference for all purposes the following applications, all commonly owned with the instant application at the time the invention was made:

U.S. Non-Provisional application Ser. No. 13/323,769), filed Dec. 12, 2011, now U.S. Pat. No. 8,719,663 issued on May 6, 2014, first named inventor Yan L I, and entitled Cross-Decoding for Non-Volatile Storage;

U.S. Provisional Application Ser. No. 61/422,198), filed Dec. 12, 2010, first named inventor Yan L I, and entitled Cross-Decoding for Non-Volatile Storage;

PCT Application Serial No. PCT/US11/28244), filed Mar. 11, 2011, first named inventor Hao ZHONG, and entitled LDPC Erasure Decoding for Flash Memories;

PCT Application Serial No. PCT/US11/57914), filed Oct. 26, 2011, first named inventor Yan L I, and entitled Adaptive ECC Techniques for Flash Memory Based Data Storage; and PCT Application Serial No. PCT/US11/62726), filed Nov. 30, 2011, first named inventor Jeremy Isaac Nathaniel WERNER, and entitled Dynamic Higher-Level Redundancy Mode Management with Independent Silicon Elements.

BACKGROUND

1. Field

Advancements in non-volatile storage systems are needed to provide improvements in performance, efficiency, and utility of use.

2. Related Art

Unless expressly identified as being publicly or well known, mention herein of techniques and concepts, including for context, definitions, or comparison purposes, should not be construed as an admission that such techniques and concepts are previously publicly known or otherwise part of the prior art. All references cited herein (if any), including patents, patent applications, and publications, are hereby incorporated by reference in their entireties, whether specifically incorporated or not, for all purposes.

SYNOPSIS

The invention may be implemented in numerous ways, including as a process, an article of manufacture, an apparatus, a system, a composition of matter, and a computer readable medium such as a computer readable storage medium (e.g. media in an optical and/or magnetic mass storage device such as a disk, or an integrated circuit having non-volatile storage such as flash storage) or a computer network wherein program instructions are sent over optical or electronic communication links. In this specification, these implementations, or any other form that the invention may take, may be referred to as techniques. The Detailed Description provides an exposition of one or more embodiments of the invention that enable improvements in performance, efficiency, and utility of use in the field identified above. The Detailed Description includes an Introduction to facilitate the more rapid understanding of the remainder of the Detailed Description. The Introduction includes Example Embodiments of one or more of systems, methods, articles of manufacture, and computer readable media in accordance with the concepts described herein. As is discussed in more detail in the Conclusions, the invention encompasses all possible modifications and variations within the scope of the issued claims.

DETAILED DESCRIPTION

Figure 1A:
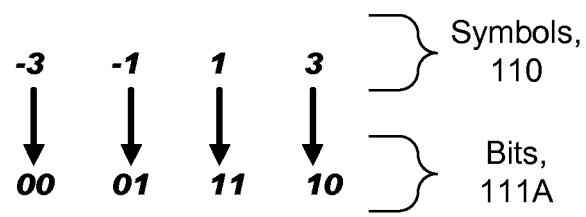
FIGS. 1A-1D illustrate selected mappings between symbols and bits.

A detailed description of one or more embodiments of the invention is provided below along with accompanying figures illustrating selected details of the invention. The invention is described in connection with the embodiments. The embodiments herein are understood to be merely exemplary, the invention is expressly not limited to or by any or all of the embodiments herein, and the invention encompasses numerous alternatives, modifications, and equivalents. To avoid monotony in the exposition, a variety of word labels (including but not limited to: first, last, certain, various, further, other, particular, select, some, and notable) may be applied to separate sets of embodiments; as used herein such labels are expressly not meant to convey quality, or any form of preference or prejudice, but merely to conveniently distinguish among the separate sets. The order of some operations of disclosed processes is alterable within the scope of the invention. Wherever multiple embodiments serve to describe variations in process, method, and/or program instruction features, other embodiments are contemplated that in accordance with a predetermined or a dynamically determined criterion perform static and/or dynamic selection of one of a plurality of modes of operation corresponding respectively to a plurality of the multiple embodiments. Numerous specific details are set forth in the following description to provide a thorough understanding of the invention. The details are provided for the purpose of example and the invention may be practiced according to the claims without some or all of the details. For the purpose of clarity, technical material that is known in the technical fields related to the invention has not been described in detail so that the invention is not unnecessarily obscured.

Introduction

This introduction is included only to facilitate the more rapid understanding of the Detailed Description; the invention is not limited to the concepts presented in the introduction (including explicit examples, if any), as the paragraphs of any introduction are necessarily an abridged view of the entire subject and are not meant to be an exhaustive or restrictive description. For example, the introduction that follows provides overview information limited by space and organization to only certain embodiments. There are many other embodiments, including those to which claims will ultimately be drawn, discussed throughout the balance of the specification.

Acronyms

Elsewhere herein various shorthand abbreviations (e.g. acronyms) refer to certain elements. The descriptions of at least some of the acronyms follow.

| Acronym | Description |
| --- | --- |
| ASCII | American Standard Code for Information Interchange |
| BCH | Bose Chaudhuri Hocquenghem |
| CD | Compact Disk |
| CF | Compact Flash |
| CMOS | Complementary Metal Oxide Semiconductor |
| CPU | Central Processing Unit |
| CRC | Cyclic Redundancy Check |
| DDR | Double-Data-Rate |
| DMA | Direct Memory Access |
| DVD | Digital Versatile/Video Disk |
| ECC | Error-Correcting Code |
| eSATA | external Serial Advanced Technology Attachment |
| FEC | Forward Error Correction |
| HDD | Hard Disk Drive |
| IC | Integrated Circuit |
| IDE | Integrated Drive Electronics |
| JPEG | Joint Photographic Experts Group |
| LBA | Logical Block Address |
| LDPC | Low-Density Parity-Check |
| LPN | Logical Page Number |
| LSB | Least Significant Bit |
| MLC | Multi-Level Cell |
| MMC | MultiMediaCard |
| MPEG | Moving Picture Experts Group |
| MSB | Most Significant Bit |
| NCQ | Native Command Queuing |
| ONFI | Open NAND Flash Interface |
| PC | Personal Computer |
| PCIe | Peripheral Component Interconnect express (PCI express) |
| PDA | Personal Digital Assistant |
| RAID | Redundant Array of Inexpensive/Independent Disks |
| RASIE | Redundant Array of Silicon independent Elements |
| RS | Reed-Solomon |
| SAS | Serial Attached Small Computer System Interface (Serial SCSI) |
| SATA | Serial Advanced Technology Attachment (Serial ATA) |
| SCSI | Small Computer System Interface |
| SD | Secure Digital |
| SLC | Single-Level Cell |
| SMART | Self-Monitoring Analysis and Reporting Technology |
| SSD | Solid-State Disk/Drive |
| SNR | Signal to Noise Ratio |
| USB | Universal Serial Bus |

NAND flash memory uses an array of floating gate transistors to store information. In SLC technology, each bit cell (e.g. floating gate transistor) is enabled to store one bit of information. In MLC technology, each bit cell is enabled to store multiple bits of information. As manufacturing technology (e.g. CMOS technology) scales down, each floating gate stores fewer electrons. Further, as storage capacity and density increase, each bit cell stores more bits. Therefore, values stored in the bit cells are represented by smaller voltage ranges. Uncertainties in sensing and/or changes in amount of stored electrons over time increase a probability for data to be stored or read incorrectly. Use of one or more redundancy and/or ECC techniques (e.g. intra-flash-memory-element) enables correct retrieval of otherwise corrupted data from NAND flash memory, overcoming, in some usage scenarios, some of the aforementioned difficulties.

Some types of SSDs use flash memory to provide non-volatile storage (e.g., the flash memory retains information without application of power). Use of one or more ECC and/or redundancy techniques (e.g. inter-flash-memory-element) enables correct retrieval of otherwise corrupted data from flash memory, and/or enables proper system-level operation of an SSD even when one or more flash memory elements fail intermittently or permanently.

For example, a Solid-State Disk (SSD) controller enables using relatively unreliable (but cost- and density-efficient) MLC flash memories as non-volatile storage for SSD implementations via various techniques such as cross-decoding. Cross-decoding assists decoding of an otherwise uncorrectable error when decoding a desired page of a multi-level-cell technology flash memory. An SSD controller adjusts space allocated to redundancy respectively within various pages (e.g. upper, middle, and lower pages) such that the respective pages have respective effective BERs, optionally including cross-decoding, that approach one another. Alternatively the controller adjusts the allocation to equalize and/or reduce decoding time (or alternatively access time), optionally including decoding time (accessing time) accrued as a result of cross-decoding when there is an otherwise uncorrectable error. The adjusting is via (a) respective ratios between allocation for ECC redundancy and user data space, and/or (b) respective coding rates and/or coding techniques for each of the various pages. Alternatively the controller adjusts the allocation to maximize total usable capacity by allocating to redundancy and data for the various pages, assuming that cross-decoding is to be used.

In various embodiments, cross-decoding proceeds as follows. An initial attempt is made to decode a desired page, of a plurality of pages (e.g. one of lower, middle, or upper pages) of an MLC, using a primary decoding operation (e.g., using a fast hard-decision decoder). For the primary decoding, the desired page (the bits corresponding to the page) to be decoded is initially read and the other pages (the bits corresponding to the other pages) are not initially read. For an uncorrectable error in the primary decoding of the desired page, cross-decoding is then used. This includes the read and attempted decode of the cross (other) page, with respect to the desired page. Successful decoding results for the cross page are subsequently used to assist a new attempt at decoding of the desired page. Should the primary decoding directly succeed, the cross page read and decode are not performed.

In some embodiments, cross-decoding is iterative, via repeated attempted decoding of a desired page using results of decoding one or more associated cross pages of the desired page. For example, decoding results of a middle page are iteratively fed into decoding an upper page associated with the middle page. For another example, decoding results of a lower page are fed into decoding a middle page associated with the lower page, and decoding results of an upper page (associated with the middle page) are fed into another decoding of the middle page.

In some embodiments, cross-decoding is for benefit of decoding both a page and an associated cross page, by feeding results of decoding the page into decoding the cross page, and by feeding results of decoding the cross page into decoding of the page. For example, during a relatively earlier portion of a lifetime of a memory element, feeding results of decoding a page into decoding a cross page associated with the page is beneficial, and during a relatively later portion of the lifetime, feeding results of decoding the associated cross page into decoding the page is beneficial. For another example, when accessing a first portion of a page, feeding results of decoding a cross page associated with the page into decoding the page is beneficial, and when accessing a second portion of the associated cross page (corresponding to memory cells distinct from the first portion), feeding results of decoding the page into decoding the cross page is beneficial.

In some embodiments, accessing compressed data of varying-sized quanta in non-volatile memory provides improved storage efficiency in some usage scenarios. For example, a Solid-State Disk (SSD) controller receives (uncompressed)

data from a computing host (e.g. relating to a disk write command), compresses the data, and stores the compressed data into flash memory. In response to a subsequent request from the computing host (e.g. relating to a disk read command), the SSD controller reads the compressed data from the flash memory, uncompresses the compressed data, and provides the uncompressed data to the computing host. The compressed data is stored in the flash memory according to varying-sized quanta, the quanta size varying due to, e.g., compression algorithm, operating mode, and compression effectiveness on various data. The SSD controller uncompresses the data in part by consulting an included map table to determine where header(s) are stored in the flash memory. The SSD controller parses the header(s) obtained from the flash memory to determine where appropriate (compressed) data is stored in the flash memory. The SSD controller uncompresses the appropriate data from the flash memory to produce the uncompressed data to provide to the computing host.

In various embodiments, an SSD controller includes a host interface for interfacing with a computing host, a flash interface for interfacing with flash memory, and circuitry for controlling the interfaces and performing (and/or controlling various aspects of the performing) compressing and uncompressing, as well as various techniques for error correction.

According to various embodiments, some host interfaces are compatible with one or more of a USB interface standard, a CF interface standard, an MMC interface standard, an SD interface standard, a Memory Stick interface standard, an xD-picture card interface standard, an IDE interface standard, a SATA interface standard, a SCSI interface standard, a SAS interface standard, and a PCIe interface standard. According to various embodiments, the computing host is all or any portions of a computer, a workstation computer, a server computer, a storage server, a PC, a laptop computer, a notebook computer, a netbook computer, a PDA, a media player, a media recorder, a digital camera, a cellular handset, a cordless telephone handset, and an electronic game. In some embodiments, an interfacing host (such as an SAS/SATA bridge) operates as a computing host.

According to various embodiments, some SSDs are compatible with form-factors, electrical interfaces, and/or protocols used by magnetic and/or optical non-volatile storage, such as HDDs, CD drives, and DVD drives. In various embodiments, SSDs use various combinations of zero or more parity codes, zero or more RS codes, zero or more BCH codes, zero or more Viterbi or other trellis codes, and zero or more LDPC codes.

Example Embodiments

In concluding the introduction to the detailed description, what follows is a collection of example embodiments, including at least some explicitly enumerated as "ECs" (Example Combinations), providing additional description of a variety of embodiment types in accordance with the concepts described herein; these examples are not meant to be mutually exclusive, exhaustive, or restrictive; and the invention is not limited to these example embodiments but rather encompasses all possible modifications and variations within the scope of the issued claims.

EC1) A method comprising:
encoding data to write to first and second pages of memory elements;
first decoding of the first page;
first decoding of the second page;
in response to the first decoding of the first page detecting an uncorrectable error, selectively performing second decoding of the first page based at least in part on at least some results of the first decoding of the second page; and
managing one or more of the act of encoding, the two acts of first decoding, and the act of second decoding to improve an access time with respect to a host request to read data stored in a storage device comprising the memory elements.

EC2) A method comprising:
encoding data to write to first and second pages of memory elements;
first decoding of the first page;
first decoding of the second page;
in response to the first decoding of the first page detecting an uncorrectable error, performing second decoding of the first page based at least in part on at least some results of the first decoding of the second page;
third decoding of the first page;
second decoding of the second page; and
in response to the second decoding of the second page detecting an uncorrectable error, performing third decoding of the second page based at least in part on at least some results of the third decoding of the first page.

EC3) The method of EC2, wherein the first decoding of the first page occurs at a relatively earlier portion of a lifetime of the memory elements, and the second decoding of the second page occurs at a relatively later portion of the lifetime.

EC4) The method of EC2, wherein the first decoding of the second page is of a first portion of the second page, and the second decoding of the second page is of a second portion of the second page, the first and the second portions being distinct from each other.

EC5) A method comprising:
encoding data to write to first and second pages of memory elements;
first decoding of the first page;
first decoding of the second page;
second decoding of the first page based at least in part on at least some results of the first decoding of the second page; and
second decoding of the second page based at least in part on at least some results of the first decoding of the first page.

EC6) The method of EC1, EC2, or EC5, wherein the first decoding of the second page detects an uncorrectable error.

EC7) A method comprising:
encoding data to write to first and second pages of memory elements;
first decoding of the first page;
first decoding of the second page;
in response to the first decoding of the first page detecting an uncorrectable error, selectively performing second decoding of the first page based at least in part on at least some results of the first decoding of the second page; and
wherein the first decoding of the second page detects an uncorrectable error.

EC8) The method of EC2, EC5, or EC7, further comprising managing one or more of the act of encoding, all of the acts of first decoding, all the acts of second decoding, and all of the acts of third decoding (if any) to improve one or more performance parameters associated with a storage device implemented at least in part with the memory elements.

EC9) The method of EC1, EC2, EC5, or EC7, wherein the first decoding of the first page and the first decoding of the second page are in response to an uncorrectable error when attempting to read one or more of the first and the second pages.

EC10) The method of EC1, EC2, EC5, or EC7, further comprising iterative decoding of the first page based at least in part on at least some results of previous iterative decoding of the second page.

EC11) The method of EC1, EC2, EC5, or EC7, wherein the first decoding of the first page and the first decoding of the second page are in accordance with respective Error-Correcting Code (ECC) techniques.

EC12) The method of EC1, EC2, EC5, or EC7, wherein the first and the second decoding of the first page are performed at least in part via a first decoder, and the first decoding of the second page is performed at least in part via a second decoder.

EC13) The method of EC12, wherein the first and the second decoders are selectively cross-coupled to enable the second decoding of the first page to be based at least in part on the at least some results of the first decoding of the second page and to further enable the second decoding (if any) of the second page to be based at least in part on the at least some results of the first decoding of the first page (if any).

EC14) The method of EC1, EC2, EC5, or EC7, wherein the memory elements comprise flash memory devices comprising at least a portion of a Solid-State Disk (SSD).

EC15) A system comprising:
  a decoder circuit enabled to decode first and second pages of memory elements;
  a control circuit enabled to direct the decoder circuit to perform a first decoding of the first and the second pages, and in response to the first decoding of the first page detecting an uncorrectable error, selectively direct the decoder circuit to perform a second decoding of the first page based at least in part on at least some results of the first decoding of the second page; and
  wherein the control circuit is further enabled to manage the decoder circuit to improve an access time with respect to a host request to read data stored in a storage device comprising the memory elements.

EC16) A system comprising:
  a decoder circuit enabled to decode first and second pages of memory elements;
  a control circuit enabled to direct the decoder circuit to perform a first decoding of the first and the second pages, and in response to the first decoding of the first page detecting an uncorrectable error, selectively direct the decoder circuit to perform a second decoding of the first page based at least in part on at least some results of the first decoding of the second page; and
  wherein the control circuit is further enabled to, in response to the first decoding of the second page detecting an uncorrectable error, selectively direct the decoder circuit to perform a second decoding of the second page based at least in part on at least some results of the first decoding of the first page.

EC17) A system comprising:
  a decoder circuit enabled to decode first and second pages of memory elements;
  a control circuit enabled to direct the decoder circuit to perform a first decoding of the first and the second pages, and direct the decoder circuit to perform a second decoding of the first and the second pages; and
  wherein the second decoding of the first page is based at least in part on at least some results of the first decoding of the second page, and the second decoding of the second page is based at least in part on at least some results of the first decoding of the first page.

EC18) The system of EC15, EC16, or EC17, wherein the first decoding of the second page detects an uncorrectable error.

EC19) A system comprising:
  a decoder circuit enabled to decode first and second pages of memory elements;
  a control circuit enabled to direct the decoder circuit to perform a first decoding of the first and the second pages, and in response to the first decoding of the first page detecting an uncorrectable error, selectively direct the decoder circuit to perform a second decoding of the first page based at least in part on at least some results of the first decoding of the second page; and
  wherein the first decoding of the second page detects an uncorrectable error.

EC20) The system of EC15, EC16, EC17, or EC19, wherein the control circuit is further enabled to manage the encoder and the decoder circuits to improve one or more performance parameters associated with a storage device implemented at least in part with the memory elements.

EC21) The system of EC15, EC16, EC17, or EC19, wherein the decoder circuit comprises first and second decoder circuits respectively enabled to perform the decodes of the first and the second pages.

EC22) The system of EC21, wherein the first and second decoder circuits implement respective Error-Correcting Code (ECC) techniques.

EC23) The system of EC15, EC16, EC17, or EC19, wherein the memory elements comprise flash memory devices comprising at least a portion of a Solid-State Disk (SSD).

EC24) A tangible computer readable medium having a set of instructions stored therein that when executed by a processing element cause the processing element to perform operations comprising:
  encoding data to write to first and second pages of memory elements;
  first decoding of the first page;
  first decoding of the second page;
  in response to the first decoding of the first page detecting an uncorrectable error, selectively performing second decoding of the first page based at least in part on at least some results of the first decoding of the second page; and
  managing one or more of the act of encoding, the two acts of first decoding, and the act of second decoding to improve an access time with respect to a host request to read data stored in a storage device comprising the memory elements.

EC25) A tangible computer readable medium having a set of instructions stored therein that when executed by a processing element cause the processing element to perform operations comprising:
  encoding data to write to first and second pages of memory elements;
  first decoding of the first page;
  first decoding of the second page;
  in response to the first decoding of the first page detecting an uncorrectable error, performing second decoding of the first page based at least in part on at least some results of the first decoding of the second page;
  third decoding of the first page;
  second decoding of the second page; and
  in response to the second decoding of the second page detecting an uncorrectable error, performing third decoding of the second page based at least in part on at least some results of the third decoding of the first page.

EC26) The tangible computer readable medium of EC25, wherein the first decoding of the first page occurs at a relatively earlier portion of a lifetime of the memory elements, and the second decoding of the second page occurs at a relatively later portion of the lifetime.

EC27) The tangible computer readable medium of EC25, wherein the first decoding of the second page is of a first portion of the second page, and the second decoding of the second page is of a second portion of the second page, the first and the second portions being distinct from each other.

EC28) A tangible computer readable medium having a set of instructions stored therein that when executed by a processing element cause the processing element to perform operations comprising:
  encoding data to write to first and second pages of memory elements;
  first decoding of the first page;
  first decoding of the second page;
  second decoding of the first page based at least in part on at least some results of the first decoding of the second page; and
  second decoding of the second page based at least in part on at least some results of the first decoding of the first page.

EC29) The tangible computer readable medium of EC24, EC25, or EC28, wherein the first decoding of the second page detects an uncorrectable error.

EC30) A tangible computer readable medium having a set of instructions stored therein that when executed by a processing element cause the processing element to perform operations comprising:
  encoding data to write to first and second pages of memory elements;
  first decoding of the first page;
  first decoding of the second page;
  in response to the first decoding of the first page detecting an uncorrectable error, selectively performing second decoding of the first page based at least in part on at least some results of the first decoding of the second page; and
  wherein the first decoding of the second page detects an uncorrectable error.

EC31) The tangible computer readable medium of EC25, EC28, or EC30, further comprising operations comprising managing one or more of the operation of encoding, all of the operations of first decoding, all the operations of second decoding, and all of the operations of third decoding (if any) to improve one or more performance parameters associated with a storage device implemented at least in part with the memory elements.

EC32) The tangible computer readable medium of EC24, EC25, EC28, or EC30, wherein the memory elements comprise flash memory devices comprising at least a portion of a Solid-State Disk (SSD).

EC33) Any of the foregoing ECs wherein the performance parameters comprise any one or more of
  access time of the storage device with respect to a request from a host to read one or more of the first and the second pages,
  decode time of the first page,
  Bit Error Rate (BER) variation of one or more of the first and the second pages,
  Bit Error Rate (BER) variation between the first and the second pages, and
  a number of times the memory elements are accessed.

EC34) Any of the foregoing ECs wherein the respective ECC techniques are distinct.

EC35) Any of the foregoing ECs wherein the respective ECC techniques are identical.

EC36) Any of the foregoing ECs wherein at least one of the respective ECC techniques comprises Low-Density Parity-Check (LDPC) decoding.

EC37) Any of the foregoing ECs wherein the memory elements comprise Multi-Level-Cell (MLC) memory elements.

EC38) The combination of EC37, wherein a particular bit of the first page and a corresponding bit of the second page are stored in a same cell of one of the MLC memory elements.

EC39) The combination of EC37, wherein at least one bit of the first and at least one corresponding bit of the second page are accessible via a same bitline.

EC40) The combination of EC37, wherein the first and the second pages are adjacent pages of the MLC memory elements.

EC41) The combination of EC37, wherein at least a portion of the MLC memory elements is organized in a plurality of blocks, and the first and the second pages are of a same one of the blocks.

EC42) The combination of EC41, wherein the first and the second pages are operable via a same wordline.

EC43) The combination of EC37, wherein the first and the second pages correspond to a same plurality of N particular ones of the MLC memory elements.

EC44) A system comprising:
  a means for allocating storage space of one or more flash memories respectively to redundancy and data information;
  wherein the flash memories have a plurality of cells each enabled to store a plurality of bits, the bits of the cells organized into respective pages corresponding to read/write quanta of the flash memories; and
  wherein the means for allocating is enabled to configure respective ratios of redundancy and data information to each of the pages such that an effective error rate of a first one of the pages corresponding to a first one of the bits of a first one of the cells approaches an effective error rate of a second one of the pages corresponding to a second one of the bits of the first one of the cells.

EC45) The system of EC44, wherein the effective error rates include effects of cross-decoding of the first and the second pages with respect to each other.

EC46) The system of EC44, wherein the respective ratios are at least in part via one or more of differing coding rates and techniques.

EC47) The system of EC44, further comprising a means for interfacing requests to access the flash memories with a computing host.

EC48) The system of EC47, wherein the means for interfacing is compatible with a storage interface standard.

EC49) The system of EC48, wherein the storage interface standard comprises one or more of
  a Universal Serial Bus (USB) interface standard,
  a Compact Flash (CF) interface standard,
  a MultiMediaCard (MMC) interface standard,
  a Secure Digital (SD) interface standard,
  a Memory Stick interface standard,
  an xD-picture card interface standard,
  an Integrated Drive Electronics (IDE) interface standard,
  a Serial Advanced Technology Attachment (SATA) interface standard,
  an external SATA (eSATA) interface standard,
  a Small Computer System Interface (SCSI) interface standard,
  a Serial Attached Small Computer System Interface (SAS) interface standard,
  a Fibre Channel interface standard,
  an Ethernet interface standard, and
  a Peripheral Component Interconnect express (PCIe) interface standard.

EC50) The system of EC44, further comprising a means for interfacing the flash memories to the means for allocating.

EC51) The system of EC50, wherein the means for interfacing comprises a flash memory interface.

EC52) The system of EC51, wherein the flash memory interface is compatible with one or more of
- an Open NAND Flash Interface (ONFI),
- a Toggle-mode interface,
- a Dual Data Rate (DDR) synchronous interface,
- a synchronous interface, and
- an asynchronous interface.

EC53) The system of EC44, further comprising:
- a means for interfacing requests to access the flash memories with a computing host; and
- a means for interfacing the allocating with the flash memories.

EC54) The system of EC53, wherein the means are collectively implemented in a single Integrated Circuit (IC).

EC55) The system of EC53, wherein the means are comprised in a Solid-State Disk (SSD).

EC56) The system of EC44, further comprising all or any portions of a computing host.

EC57) The system of EC56, wherein the computing host comprises one or more of
- a computer,
- a workstation computer,
- a server computer,
- a storage server,
- a Personal Computer (PC),
- a laptop computer,
- a notebook computer,
- a netbook computer,
- a Personal Digital Assistant (PDA),
- a media player,
- a media recorder,
- a digital camera,
- a cellular handset,
- a cordless telephone handset, and
- an electronic game.

EC58) The system of EC44, further comprising at least one of the flash memories.

EC59) The system of EC58, wherein the at least one flash memory comprises one or more of
- NAND flash technology storage cells, and
- NOR flash technology storage cells.

EC60) The system of EC58, wherein the at least one flash memory comprises one or more of
- Multi-Level Cell (MLC) flash technology storage cells enabled to store 4 levels (2 bits) per cell, and
- MLC flash technology storage cells enabled to store 8 levels (3 bits) per cell.

EC61) A system comprising:
- a means for allocating storage space of one or more flash memories respectively to redundancy and data information;
- wherein the flash memories have a plurality of cells each enabled to store a plurality of bits, the bits of the cells organized into respective pages corresponding to read/write quanta of the flash memories; and
- wherein the means for allocating is enabled to configure respective ratios of redundancy and data information to each of the pages such that an effective decode time of a first one of the pages corresponding to a first one of the bits of a first one of the cells approaches an effective decode time of a second one of the pages corresponding to a second one of the bits of the first one of the cells.

EC62) The system of EC61, wherein the effective decode times include effects of cross-decoding of the first and the second pages with respect to each other.

EC63) A system comprising:
- a means for allocating storage space of one or more flash memories respectively to redundancy and data information;
- wherein the flash memories have a plurality of cells each enabled to store a plurality of bits, the bits of the cells organized into respective pages corresponding to read/write quanta of the flash memories; and
- wherein the means for allocating is enabled to configure respective ratios of redundancy and data information to each of the pages such that an effective access time of a first one of the pages corresponding to a first one of the bits of a first one of the cells approaches an effective access time of a second one of the pages corresponding to a second one of the bits of the first one of the cells.

EC64) The system of EC63, wherein the effective access times include effects of cross-decoding of the first and the second pages with respect to each other.

EC65) A system comprising:
- a means for allocating storage space of one or more flash memories respectively to redundancy and data information;
- wherein the flash memories have a plurality of cells each enabled to store a plurality of bits, the bits of the cells organized into respective pages corresponding to read/write quanta of the flash memories; and
- wherein the means for allocating is enabled to configure respective ratios of redundancy and data information to each of the pages such that total user data storage space provided by the flash memories is maximized.

EC66) A system comprising:
- memory means comprising MLC memory elements and organized as a plurality of blocks, each block comprising a plurality of pages, the MLC memories comprising cells storing up to N-bits per cell, each page being a member of one of N logical page-groups, each logical page-group being associated with a respective one of the N-bits;
- encoding means for independent on-demand ECC encoding of each page written to the memory means;
- decoding means for independent on-demand ECC decoding of each page desired to be read from the memory means; and
- means for adaptively managing the encoding means and the decoding means so as to equalize across the logical page-groups of the plurality of blocks the probability of the decoding means detecting an uncorrectable error.

EC67) The system of EC66, wherein the ECC encoding used for each page written to the memory means is enabled to be a function of the block and the logical-page-group in which the page resides.

EC68) The system of EC66, wherein the ECC encoding used for each page written to the memory means is enabled to be a function of operations that affect a lifetime of the memory means.

EC69) The system of EC66, further comprising:
- means for adaptively managing the encoding means and the decoding means so as to extend a lifetime of the memory means.

EC70) The system of EC66, further comprising:
- means for adaptively managing the encoding means and the decoding means so as to maximize the total capacity of the memory means.

EC71) The system of EC66, wherein the decoding means is a primary decoding means, the page desired to be read from the memory means is associated with a particular physical address within the memory means, and the page desired to be read is further associated with a first logical page-group associated with a first one of the N-bits, and further comprising:

adjacent page decoding means for independent ECC decoding of at least one adjacent page with respect to the desired page, each adjacent page being a member of a different logical page-group associated with a different one of the N-bits but otherwise being associated with the same particular physical address within the memory means, the decoding of the at least one adjacent page being performed subsequent to the incurring of the page decode error while attempting the primary decoding of the desired page; and cross decoding means for secondary decoding of each page incurring the page decode error, the secondary decoding incorporating the decoding of the at least one adjacent page.

EC72) The system of EC66, further comprising:

a means for interfacing requests to access the MLC memory elements with a computing host.

EC73) The system of EC72, wherein the system is implemented in a single Integrated Circuit (IC).

EC74) The system of EC72, wherein the system is comprised in a Solid-State Disk (SSD).

EC75) The system of EC72, further comprising all or any portions of the computing host.

EC76) A system comprising:

memory means comprising MLC memory elements comprising a plurality of blocks, each block comprising a plurality of pages;

encoding means for independent on-demand ECC encoding of each page written to the memory means;

primary decoding means for independent on-demand ECC decoding of each page desired to be read from the memory means;

cross decoding means for secondary decoding of each page incurring a page decode error, the secondary decoding incorporating at least one same-block same-wordline adjacent-page decoding performed in response to the page decode error; and means for adaptively managing the encoding means, the primary decoding means, and the cross decoding means as a function of operations that affect a lifetime of the memory means and to maximize the total capacity of the memory means over the lifetime.

EC77) The system of EC76, wherein the MLC memory elements comprise cells storing up to N-bits per cell, each page is a member of one of N logical page-groups, each logical page-group is associated with a respective one of the N-bits, and further comprising:

means for adaptively managing the encoding means and the primary decoding means so as to equalize across the logical page-groups of the plurality of blocks the probability of the primary decoding means detecting an uncorrectable error.

EC78) The system of EC76, further comprising:

a means for interfacing requests to access the MLC memory elements with a computing host.

EC79) The system of EC78, wherein the system is implemented in a single Integrated Circuit (IC).

EC80) The system of EC78, wherein the system is comprised in a Solid-State Disk (SSD).

EC81) The system of EC78, further comprising all or any portions of the computing host.

EC82) The system of EC78, further comprising a means for compressing data from the computing host for storage within the memory means.

System

Hereinafter, 'Appendix D' refers to Appendix D of U.S. Provisional Application (Ser. No. 61/422,198), filed Dec. 12, 2010, first named inventor Yan Li, and entitled Cross-Decoding for Non-Volatile Storage.

Figure 1B:
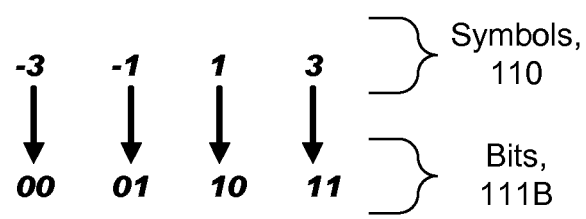

FIGS. 1A-1D illustrate various mappings between symbols (upper rows) and bits (lower rows) in 4-level/2-bit multilevel-cell (MLC) flash memories. The symbols "–3", "4", "1", and "3" (illustrated as Symbols, 110 in FIGS. 1A-1D), are abstractions for four relative threshold voltages. FIG. 1A illustrates "gray mapping", used in some communication systems because any error of a Gray-mapped symbol only incurs one bit of error. FIG. 1B illustrates "natural mapping", providing advantages for bit-to-cell mapping in flash devices, in some embodiments. In some embodiments and/or usage scenarios, a particular mapping is chosen by a flash memory vendor/manufacturer. The two bits illustrated in the lower rows of FIG. 1A (Bits, 111A) and FIG. 1B (Bits, 111B) are the left-most (MSB), and the right-most (LSB).

Figure 1C:
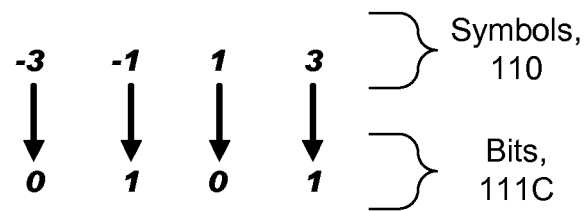
Figure 1D:
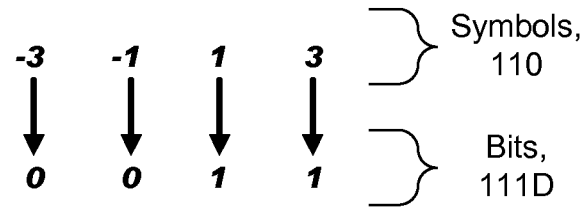

FIG. 1C repeats the natural mapping pattern of FIG. 1B, but for the LSB alone (illustrated as Bits, 111C). An error in resolving between any two adjacent symbols incurs one LSB error. Similarly, FIG. 1D repeats the natural mapping of FIG. 1B, but for the MSB alone (illustrated as Bits, 111D). The opportunity to incur MSB errors is reduced compared to the LSB case. More specifically, errors in resolving between the "–3" and "–1" symbols, or the "1" and "3" symbols, do not result in an MSB error; only errors in resolving between the "–1" and "1" symbols incur an MSB error. So for natural mapping, the error probability for the MSB case is better than that of the LSB case. This is illustrated in the plot of Appendix D—FIG. 1, where the simulated LSB BER is about 3 times worse than the MSB BER. In some MLC non-volatile memory embodiments, the LSB and MSB relative BER performance are reversed.

In some situations, data is programmed and fetched in units referred to as pages. In some flash embodiments, each of the bits of an MLC memory cell is considered to belong to a respectively different page. In the case of a 4-level, 2-bit, MLC flash memory cell, for some embodiments, the page corresponding to the LSB is referred to as the lower page, and the page corresponding to the MSB is referred to as the upper or higher page.

Figure 2A:
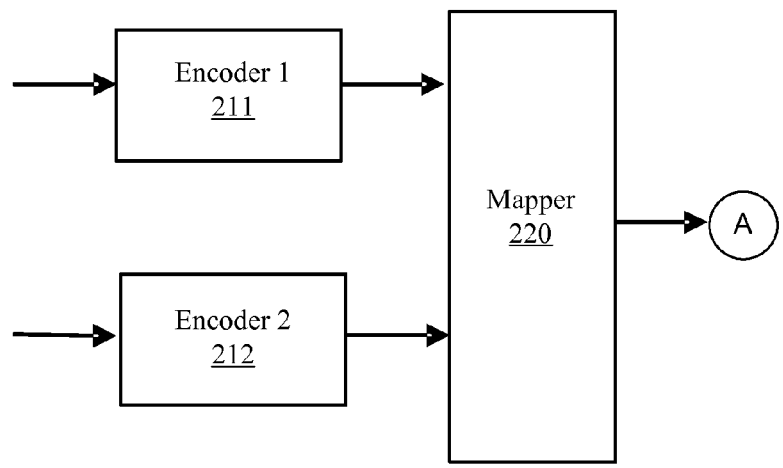
FIGS. 2A-2C illustrate selected details of a an embodiment of a Natural Mapped heuristic system modeled for bit-error-rate performance of a flash memory-based storage system.
Figure 2B:
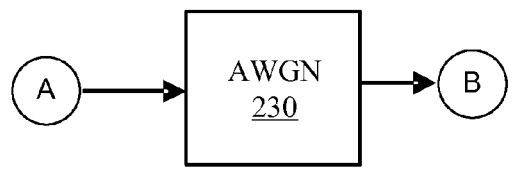
Figure 2C:
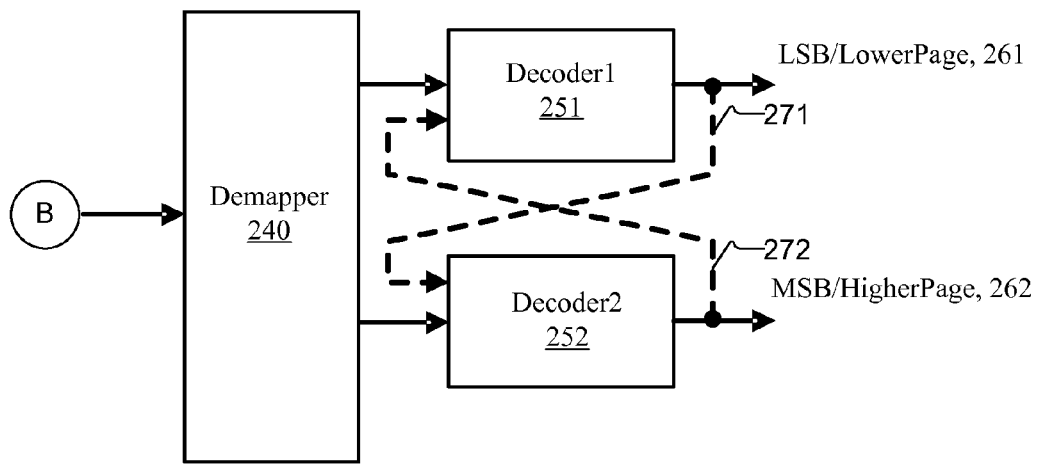

FIGS. 2A-2C illustrate selected details of a an embodiment of a Natural Mapped heuristic system modeled for bit-error-rate performance of a flash memory-based storage system (e.g. based on BER behaviors of lower and higher flash pages). Encoder 1 211 and Decoder 1 251 correspond to the LSB or Lower Page, and Encoder 2 212 and Decoder 2 252 correspond to the MSB or Higher Page. Each encoder/decoder pair is matched as complementary operations of a matched ECC redundancy scheme (matched technique and rate). The encoders accept a message word at inputs and output a code word reflective of a selected ECC redundancy scheme. The decoders accept noised code words at inputs and attempt to recover the original message. In some embodiments, the LSB path and the MSB path use identical ECC redundancy schemes. In other embodiments, the LSB path and the MSB path use differing ECC redundancy schemes.

Mapper 220 of FIG. 2A and Demapper 240 of FIG. 2C respectively convert binary codewords (such as output by the encoders and expected as input by the decoders) into analog "symbols" (such as the symbols of FIGS. 1A-1D) and back again. Conceptually, the symbols are stored into and read from the cells of the MLC flash memory and are subjected to various perturbations that unpredictably alter codewords presented to the decoders relative to codewords produced by the encoders. One or more flash memory storage devices and the perturbations thereto are abstracted in FIG. 2B as Additive White Gaussian Noise (AWGN) 230 communications channel coupling the Mapper and the Demapper. In various embodiments and/or usage scenarios, one or more of the Mappers and Demappers of FIG. 2C are implemented entirely or partially in the flash memory storage devices abstracted as the AWGN of FIG. 2B, such as via a microcontroller enabled to program and/or read storage cells of the flash memory storage devices.

As illustrated in FIG. 2C, but sans the crossed dashed lines to be discussed later, the two decoding paths are independent and there is no interaction between them. However, the two bit streams are correlated with each other. When a noised symbol is received, knowing the MSB helps to decide what the LSB is, and knowing the LSB also helps to decide what the MSB is, thus decreasing bit errors in some situations, as the following examples illustrate.

Figure 3A:
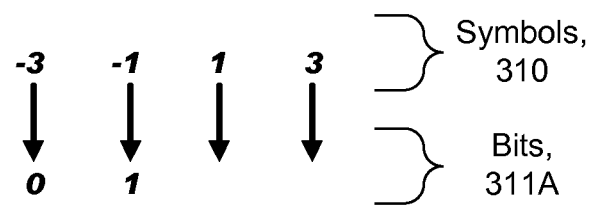
FIGS. 3A-3B illustrate selected mappings between symbols and bits when a bit in a page is known.
Figure 3B:
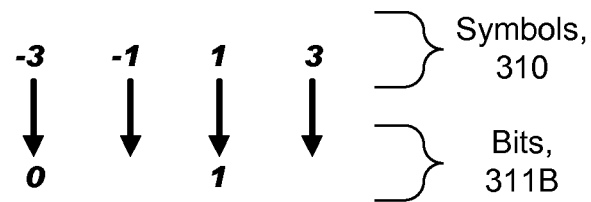

Consider a scenario wherein the symbol originally encoded was "−1" of possible symbols "−3", "4", "1", and "3" (illustrated as Symbols, 310 in FIGS. 3A-3B). As illustrated in FIG. 1B, an adjacent symbol error results in the received/readback noised symbol being either "−3" or "1". However, assume that the MSB is known to be 0, and accordingly restrict the available results as represented in FIG. 3A (illustrated as Bits, 311A). Then, if the received symbol is "1", a result is chosen as "4", because "−1" is the closest of the available results to the received "1", given the known MSB value of 0. A similar scenario exists if the MSB is known to be 1.

Conversely, if the LSB is known to be 0, the available results are accordingly restricted as represented in FIG. 3B (illustrated as Bits, 311B), prior to making an MSB decision. This improves the MSB BER because the Euclidean distance between the candidate symbols is two times larger than the original Euclidean distance in the original mapping pattern.

More generally, "cross-page decoding", or "cross-decoding", is using a correct decoding result of one of two (or more) decoders to help the other decoder(s) when a detected-error (e.g. an otherwise uncorrectable error) arises. More specifically, in cross-decoding, subsequent to a first decoding round resulting in a mixed result of an error-free decoder output and a detected-error decoder output, a second decoding round based on an improved demapping that is determined by the error-free decoding output is performed. (In all other cases, the decoding results are independent.) The cross-decoding approach enables, in some embodiments, memories with higher error rates (e.g. higher density memories and/or memories having greater numbers of bits stored per cell) to be usable when non-cross-decoding techniques would be inoperable. The cross-decoding approach, such as when used in conjunction with adaptive differing strength codes for different blocks, enables memories with blocks otherwise considered bad (e.g., by conventional, uniform code strength, non-adaptive, and non-cross-decoding techniques) to continue to be usable.

The Appendix D—FIG. 2 plot conceptually illustrates the maximal possible BER vs. SNR performance benefit of cross-decoding over independent decoding, for each of the LSB and MSB decoding paths, with both paths using a rate 8/9 (18342, 16384) LDPC code. The plot illustrates, that relative to independent decoding, cross-decoding provides about 0.7 dB SNR improvement on the LSB decoding path and about 4.5 dB SNR improvement on the MSB decoding path. The Encoder 1 output of FIG. 2A is fed to the Demapper/Decoder 2 of FIG. 2C and the Encoder 2 output (again of FIG. 2A) is fed to the Demapper/Decoder 1 (again of FIG. 2C).

In some embodiments and/or usage scenarios, rather than encoder outputs being fed to demappers/decoders, decoding outputs are fed to decoders, as illustrated by dashed crossed paths 271 and 272 of FIG. 2C. So the cross-decoding performance is bounded by the worse one of the two decoding paths. When the LSB decoding path is the worse one, the MSB decoding path result is used to help the LSB decoding path, and not vice versa. However, in some flash embodiments, the lower page (LSB) has better BER performance than the higher page (MSB). Therefore in some system implementations, there are performance/efficiency improvements.

As illustrated in the Appendix D—FIG. 2 plot, with both the LSB and MSB paths using the same rate 8/9 (18342, 16384) LDPC code, the two decoding paths operate in different SNR regions. To make the LSB and MSB decoding path operate in matched SNR regions, a different code is used for the LSB path relative to the MSB path. (Throughout, the encoding and decoding portions of a given path use matched codes.) Accordingly, the Appendix D—FIG. 3 plot illustrates BER vs. SNR performance curves while using a rate 7/8 (18432, 16128) LDPC code for the LSB path and a rate 15/16 (18432, 17280) LDPC code for the MSB path.

For the LSB path, the Appendix D—FIG. 3 curves include independent decoding as well as the cross-decoding of the LSB path with assistance from an error free decoding result of the MSB path. (If the MSB path decoding output has an error, the LSB is decoded independently). These two scenarios are illustrated to have similar operating SNR regions, with the cross-decoding scenario showing about 0.55 dB SNR improvement over an independent decoding scenario.

Also plotted in Appendix D—FIG. 3 is the performance curve of a rate 5/6 LDPC code for the LSB path with independent decoding. The 5/6 LDPC code has similar performance to that of the 7/8 LDPC code with cross-decoding. As a 7/8 code requires 1/24 less code overhead relative to the message size than a 5/6 code, cross-decoding enables a 4.17% efficiency improvement.

Another way to check possible improvement of an FEC scheme is to start with equal performances of the LSB path and the MSB path with independent decoding, and then check for improvement with cross-decoding. Another code with code rate 17/18 was designed and its performance curve is also depicted in Appendix D—FIG. 3. Because of the close-to-capacity performance of LDPC codes, it is difficult to make the two curves of LSB and MSB paths "overlap".

In simulation, rate 5/6 and rate 15/16 codes are respectively used for the LSB path and the MSB path. The results are plotted in Appendix D—FIG. 4, along with selected previous results. This plot illustrates that, instead of moving the rate 5/6 LSB curve and the rate 15/16 MSB curve together toward the left-side, because of the small performance gap between the LSB and MSB encoding/decoding paths, the effect of cross-decoding is to pull the worse performance curve closer to the better performance curve (i.e., for the cases illustrated here, use of cross-decoding for the LSB decoding curves moves the worse performance LSB decoding curves closer to the better performance MSB decoding curves). However, what could be expected is that the slope of the curves will be much steeper in the low bit error rate region than those of independent decoding because of the multiplicity effect of probability.

In an illustrative embodiment, a controller initially attempts to decode one of a plurality of pages (e.g. a lower, middle, or upper one of the pages) using a primary decoding operation (e.g., using a fast hard-decision decoder). For the primary decoding, only a desired page (bits corresponding to the desired page) to be decoded is read (if possible) and the other pages are not read. For an uncorrectable error in the primary decoding of the desired page, one or more levels of corrective operations are performed. When cross-decoding is used, the cross (other) page is subsequently read and a decode of same attempted. Successful decoding results of the cross page are subsequently used to assist a re-decoding of the desired page. If the primary decoding directly succeeds, then the cross page read and decode is not performed. As an example, if a desired page is a middle page, and a primary decoding of the middle page fails, then a lower (or an upper) page corresponding to the middle page is read and decoded, with results of the decoding used to assist in a re-decode of the (desired) middle page. As another example, if a desired page is a lower page, then results of reading/decoding of corresponding middle (or upper) pages are used to assist in re-decode of the (desired) lower page if a primary read/decode of the lower page results in an uncorrectable error.

In an illustrative embodiment, a controller attempts to equalize probability of failure (incurring an uncorrectable error) between lower and upper (or, for three-bit-per-cell, lower, middle, and upper) pages by adjusting amounts of redundancy used for each page of one or more flash memories. For example, a flash memory with MSB pages having a BER that is lower than LSB pages, is operated with more space allocated to ECC redundancy for the LSB pages than the MSB pages, such that the effective BER of the MSB and the LSB pages, optionally including cross-decoding, is approximately equal. Alternatively the controller attempts to equalize and/or reduce decoding time (or alternatively access time), optionally including decoding time (accessing time) accrued as a result of cross-decoding performed in response to an otherwise uncorrectable error. For example, a flash memory with upper pages having a BER that is less than middle and lower pages is operated with more space allocated to ECC redundancy for the middle and the lower pages than the upper pages, such that the effective decoding time of the upper, the middle, and the lower pages, optionally including cross-decoding, is approximately equal.

The equalizing and/or reducing are enabled at least in part by configuring a ratio between space devoted for ECC redundancy and space devoted to user data to be different between the various pages (lower, middle, and upper) shared by MLC memory cells of the pages. The equalizing and/or reducing are also enabled at least in part by using different coding rates and/or coding techniques in the various pages. In various embodiments, ratios chosen, coding rates, and/or coding techniques, are enabled to be determined on a block by block basis, are enabled to be a function of operations that affect a lifetime of the flash memories (such as a number of program/erase cycles, a number of read cycles, and an amount of time power has been applied), and are otherwise enabled to be adaptively managed to extend a lifetime of a storage system implemented using the flash memories.

In an illustrative embodiment, a controller attempts to maximize total usable capacity (e.g. in an SSD having one or more flash memories) by optimally allocating respective portions of space used in each page (of the flash memories) for ECC redundancy and user data. In a particular 4-level, 2-bit, implementation, for a lower page (and with complementary respect to an upper page), the portion of space used for user data is relatively increased (decreased) and the portion of space used for ECC redundancy is correspondingly decreased (increased). In addition or alternatively, the controller attempts to equalize and/or reduce access time of various locations in the SSD (e.g. by equalizing and/or reducing decode time to various locations and/or pages of the flash memories). In addition or alternatively, the controller attempts to equalize and/or reduce BER across and/or within various portions (e.g. blocks or pages) of the flash memories).

Operation

Figure 4:
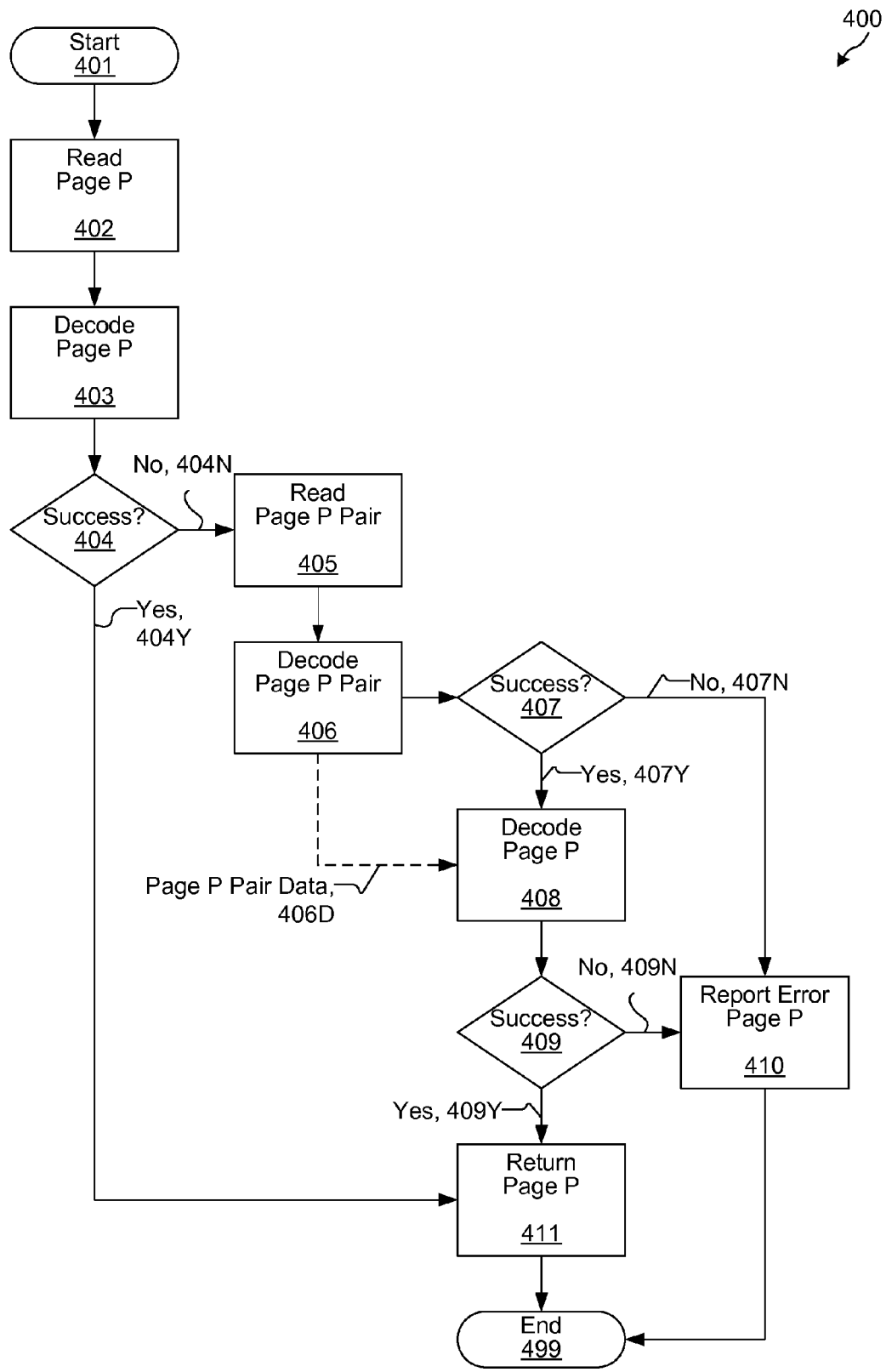
FIG. 4 illustrates selected details of a non-iterative cross-decoding embodiment.

FIG. 4 illustrates selected details of a non-iterative cross-decoding embodiment. In the figure, the term 'Page P' corresponds to the aforementioned 'desired page' and the term 'Page P Pair' corresponds to the aforementioned 'cross (other) page'. For example, a flash memory is implemented with 4-level, 2-bit, MLC technology. In a first context, a first desired page is a first upper page (having a corresponding first lower page), and Page P is the first upper page, while Page P Pair is the corresponding first lower page. In a second context, a second desired page is a second lower page (having a corresponding second upper page), and Page P is the second lower page while Page P Pair is the corresponding second upper page. For another example, a flash memory is implemented with 8-level, 3-bit MLC technology. A desired page is a middle page (having corresponding lower and upper pages), and page P is the middle page, while Page P Pair is either the corresponding lower page or the corresponding upper page, depending on which of the corresponding (lower/upper) pages are used for cross-decoding.

Various operations illustrated in the figure are performed by various elements of FIG. 2C, in various embodiments and/or usage scenarios. For example, when a desired page is an LSB page, "Decode Page P" 403 and "Decode Page P Pair" 406 are performed respectively by Decoders 1 251 and 2 252 (of FIG. 2C), and "Page P Pair Data" 406D is represented by dashed line 272 from Decoder 2 to Decoder 1. For another example, when a desired page is an MSB page, "Decode Page P" 403 and "Decode Page P Pair" 406 are performed respectively by Decoders 2 252 and 1 251 (of FIG. 2C) and "Page P Pair Data" 406D is represented by dashed line 271 from Decoder 1 to Decoder 2.

As illustrated by the figure, cross-decoding is omitted if an initial read/decode of a desired page is successful ("Success?" 404), providing the desired page without accessing another page ("Return Page P" 411). In some embodiments, determining whether the Page P Pair has been decoded successfully "Success?" 407 is based on whether any uncorrectable errors are detected. In other embodiments, success is based on whether few enough uncorrectable errors are detected to enable improved decode of the Page P. For instance, if the Page P Pair decoding is via an LDPC scheme, then even with some uncorrectable errors there are, in some usage scenarios, enough correct bits to enhance decoding of the page P.

Figure 5:
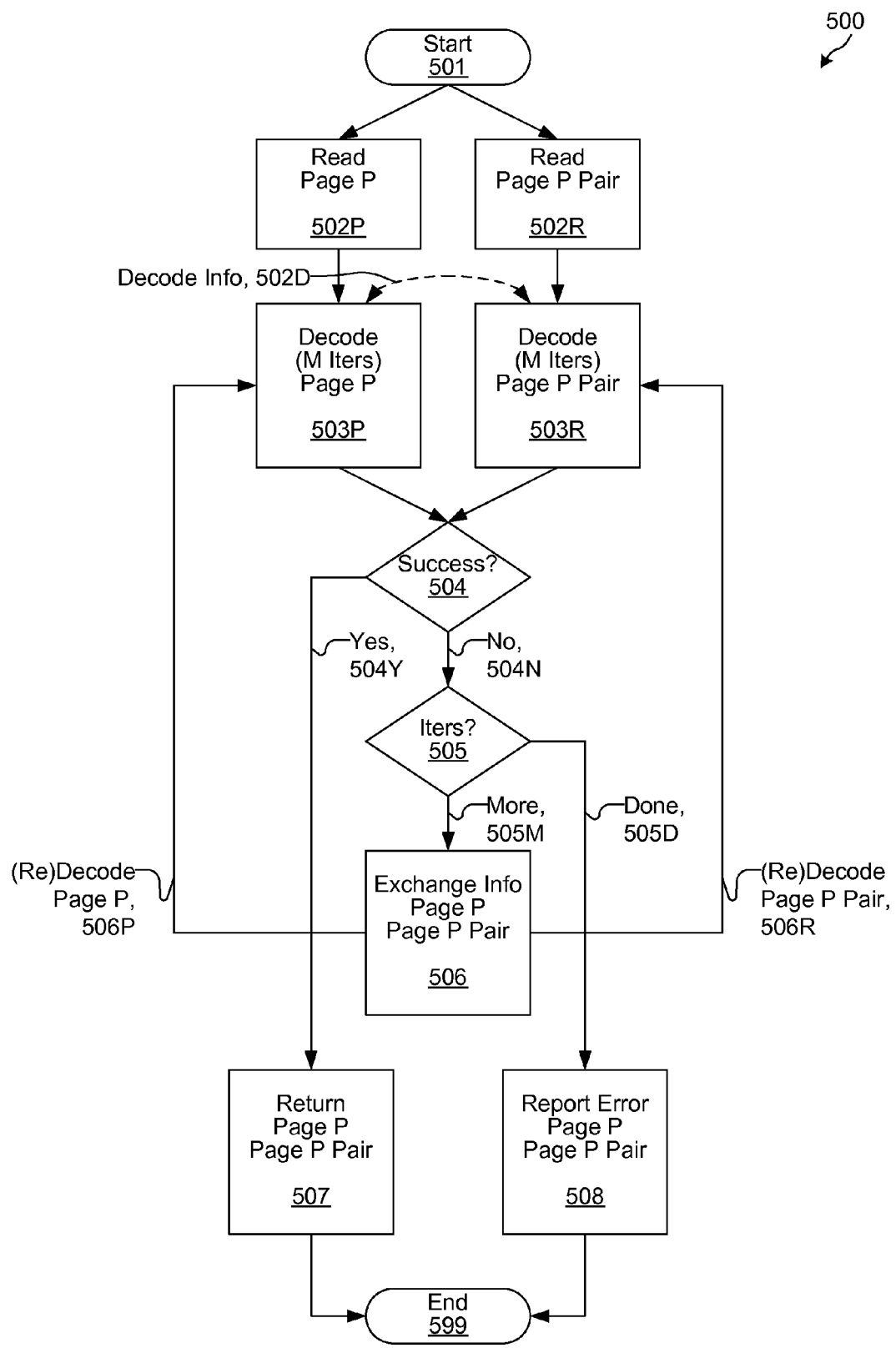
FIG. 5 illustrates selected details of an iterative cross-decoding embodiment.

FIG. 5 illustrates selected details of an iterative cross-decoding embodiment. As in FIG. 4, 'Page P' and 'Page P Pair' correspond respectively to 'desired page' and 'cross (other) page'. Various operations illustrated in FIG. 5 are performed by various elements of FIG. 2C, in various embodiments and/or usage scenarios. For example, "Decode (M Iters) Page P" 503P and "Decode (M Iters) Page P Pair" 503R are performed respectively by Decoders 1 251 and 2 252 (of FIG. 2C), and "Exchange Info Page P Page P Pair" 506 is represented by cross dashed lines 271 and 272 between Decoders 1 and 2. Similar to FIG. 4, success of decoding a Page (either the Page P or the Page P Pair) is, in some embodiments, based on zero uncorrectable errors, and in other embodiments, based on few enough uncorrectable errors to enable enhanced decoding of the other page.

References

PCT Application (Serial No. PCT/US11/28244), filed Mar. 11, 2011, first named inventor Hao Zhong, and entitled LDPC Erasure Decoding for Flash Memories, describes low-level LDPC erasure decoding techniques. PCT Application (Serial No. PCT/US11/57914), filed Oct. 26, 2011, first named inventor Yan Li, and entitled Adaptive ECC Techniques for Flash Memory Based Data Storage, describes adaptive low-level ECC techniques. PCT Application (Serial No. PCT/US11/62726), filed Nov. 30, 2011, first named inventor Jeremy Isaac Nathaniel Werner, and entitled Dynamic Higher-Level Redundancy Mode Management with Independent Silicon Elements, describes device and system implementation contexts (e.g. SSDs) and higher-level error correction techniques applicable to embodiments of the instant application.

Example Implementation Techniques

In some embodiments, various combinations of all or portions of operations performed by an encoder (such as Encoder 1 211 or Encoder 2 212 of FIG. 2A), a Mapper (such as Mapper 220 of FIG. 2A), a flash memory storage device (such as represented by AWGN 230 of FIG. 2B), a Demapper (such as Demapper 240 of FIG. 2C), a Decoder (such as Decoder 1 251 or Decoder 2 252 of FIG. 2C), and portions of a processor, microprocessor, system-on-a-chip, application-specific-integrated-circuit, hardware accelerator, or other circuitry providing all or portions of the aforementioned operations, are specified by a specification compatible with processing by a computer system. The specification is in accordance with various descriptions, such as hardware description languages, circuit descriptions, netlist descriptions, mask descriptions, or layout descriptions. Example descriptions include: Verilog, VHDL, SPICE, SPICE variants such as PSpice, IBIS, LEF, DEF, GDS-II, OASIS, or other descriptions. In various embodiments the processing includes any combination of interpretation, compilation, simulation, and synthesis to produce, to verify, or to specify logic and/or circuitry suitable for inclusion on one or more integrated circuits. Each integrated circuit, according to various embodiments, is designable and/or manufacturable according to a variety of techniques. The techniques include a programmable technique (such as a field or mask programmable gate array integrated circuit), a semi-custom technique (such as a wholly or partially cell-based integrated circuit), and a full-custom technique (such as an integrated circuit that is substantially specialized), any combination thereof, or any other technique compatible with design and/or manufacturing of integrated circuits.

In some embodiments, various combinations of all or portions of operations as described by a (e.g., a tangible) computer readable medium having a set of instructions stored therein, are performed by execution and/or interpretation of one or more program instructions, by interpretation and/or compiling of one or more source and/or script language statements, or by execution of binary instructions produced by compiling, translating, and/or interpreting information expressed in programming and/or scripting language statements. The statements are compatible with any standard programming or scripting language (such as C, C++, Fortran, Pascal, Ada, Java. VBscript, and Shell). One or more of the program instructions, the language statements, or the binary instructions, are optionally stored on one or more computer readable storage medium elements. In various embodiments some, all, or various portions of the program instructions are realized as one or more functions, routines, sub-routines, in-line routines, procedures, macros, or portions thereof.

CONCLUSION

Certain choices have been made in the description merely for convenience in preparing the text and drawings and unless there is an indication to the contrary the choices should not be construed per se as conveying additional information regarding structure or operation of the embodiments described. Examples of the choices include: the particular organization or assignment of the designations used for the figure numbering and the particular organization or assignment of the element identifiers (the callouts or numerical designators, e.g.) used to identify and reference the features and elements of the embodiments.

The words "includes" or "including" are specifically intended to be construed as abstractions describing logical sets of open-ended scope and are not meant to convey physical containment unless explicitly followed by the word "within."

Although the foregoing embodiments have been described in some detail for purposes of clarity of description and understanding, the invention is not limited to the details provided. There are many embodiments of the invention. The disclosed embodiments are exemplary and not restrictive.

It will be understood that many variations in construction, arrangement, and use are possible consistent with the description, and are within the scope of the claims of the issued patent. For example, interconnect and function-unit bit-widths, clock speeds, and the type of technology used are variable according to various embodiments in each component block. The names given to interconnect and logic are merely exemplary, and should not be construed as limiting the concepts described. The order and arrangement of flowchart and flow diagram process, action, and function elements are variable according to various embodiments. Also, unless specifically stated to the contrary, value ranges specified, maximum and minimum values used, or other particular specifications (such as flash memory technology types; and the number of entries or stages in registers and buffers), are merely those of the described embodiments, are expected to track improvements and changes in implementation technology, and should not be construed as limitations.

Functionally equivalent techniques known in the art are employable instead of those described to implement various components, sub-systems, operations, functions, routines, sub-routines, in-line routines, procedures, macros, or portions thereof. It is also understood that many functional aspects of embodiments are realizable selectively in either hardware (i.e., generally dedicated circuitry) or software (i.e., via some manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include, but are not limited to: differences in partitioning; different form factors and configurations; use of different operating systems and other system software; use of different interface standards, network protocols, or communication links; and other variations to be expected when implementing the concepts described herein in accordance with the unique engineering and business constraints of a particular application.

The embodiments have been described with detail and environmental context well beyond that required for a minimal implementation of many aspects of the embodiments described. Those of ordinary skill in the art will recognize that some embodiments omit disclosed components or features without altering the basic cooperation among the remaining elements. It is thus understood that much of the details disclosed are not required to implement various aspects of the embodiments described. To the extent that the remaining elements are distinguishable from the prior art, components and features that are omitted are not limiting on the concepts described herein.

All such variations in design are insubstantial changes over the teachings conveyed by the described embodiments. It is also understood that the embodiments described herein have broad applicability to other computing and networking applications, and are not limited to the particular application or industry of the described embodiments. The invention is thus to be construed as including all possible modifications and variations encompassed within the scope of the claims of the issued patent.

What is claimed is:

1. A method comprising:
   allocating storage space of one or more flash memories respectively to redundancy and data information;
   wherein the flash memories have a plurality of cells each enabled to store a plurality of bits, the bits of the cells organized into respective pages corresponding to read/write quanta of the flash memories; and
   wherein the allocating comprises configuring respective ratios of redundancy and data information to each of the pages such that an effective error rate of a first one of the pages corresponding to a first one of the bits of a first one of the cells approaches an effective error rate of a second one of the pages corresponding to a second one of the bits of the first one of the cells.

2. The method of claim 1, wherein the effective error rates include effects of cross-decoding of the first and the second pages with respect to each other.

3. The method of claim 1, wherein the respective ratios are in accordance with one or more of differing coding rates and techniques.

4. The method of claim 1, further comprising interfacing requests to access the flash memories with a computing host.

5. The method of claim 4, wherein the interfacing is compatible with a storage interface standard.

6. The method of claim 5, wherein the storage interface standard comprises one or more of:
   a Universal Serial Bus (USB) interface standard,
   a Compact Flash (CF) interface standard,
   a MultiMediaCard (MMC) interface standard,
   a Secure Digital (SD) interface standard,
   a Memory Stick interface standard,
   an xD-picture card interface standard,
   an Integrated Drive Electronics (IDE) interface standard,
   a Serial Advanced Technology Attachment (SATA) interface standard,
   an external SATA (eSATA) interface standard,
   a Small Computer System Interface (SCSI) interface standard,
   a Serial Attached Small Computer System Interface (SAS) interface standard,
   a Fibre Channel interface standard, an Ethernet interface standard, and
   a Peripheral Component Interconnect express (PCie) interface standard.

7. The method of claim 5, wherein the computing host comprises one or more of:
   a computer,
   a workstation computer,
   a server computer,
   a storage server,
   a Personal Computer (PC),
   a laptop computer,
   a notebook computer,
   a netbook computer,
   a Personal Digital Assistant (PDA),
   a media player,
   a media recorder,
   a digital camera,
   a cellular handset,
   a cordless telephone handset, and
   an electronic game.

8. The method of claim 1, further comprising interfacing the flash memories.

9. The method of claim 8, wherein the interfacing is at least in part via a flash memory interface.

10. A non-transitory computer readable medium having a set of instructions stored therein that when executed by a processing element cause the processing element to perform operations comprising:
    allocating storage space of one or more flash memories respectively to redundancy and data information;
    wherein the flash memories have a plurality of cells each enabled to store a plurality of bits, the bits of the cells organized into respective pages corresponding to read/write quanta of the flash memories; and
    wherein the allocating comprises configuring respective ratios of redundancy and data information to each of the pages such that an effective error rate of a first one of the pages corresponding to a first one of the bits of a first one of the cells approaches an effective error rate of a second one of the pages corresponding to a second one of the bits of the first one of the cells.

11. The non-transitory computer readable medium of claim 10, wherein the effective error rates include effects of cross-decoding of the first and the second pages with respect to each other.

12. The non-transitory computer readable medium of claim 10, wherein the respective ratios are in accordance with one or more of differing coding rates and techniques.

13. The non-transitory computer readable medium of claim 10, wherein the operations further comprise interfacing requests to access the flash memories with a computing host.

14. The non-transitory computer readable medium of claim 13, wherein the interfacing is compatible with a storage interface standard.

15. The non-transitory computer readable medium of claim 14, wherein the storage interface standard comprises one or more of:
    a Universal Serial Bus (USB) interface standard,
    a Compact Flash (CF) interface standard,
    a MultiMediaCard (MMC) interface standard,
    a Secure Digital (SD) interface standard,
    a Memory Stick interface standard,
    an xD-picture card interface standard,
    an Integrated Drive Electronics (IDE) interface standard,
    a Serial Advanced Technology Attachment (SATA) interface standard,
    an external SATA (eSATA) interface standard,
    a Small Computer System Interface (SCSI) interface standard,
    a Serial Attached Small Computer System Interface (SAS) interface standard,
    a Fibre Channel interface standard,
    an Ethernet interface standard, and
    a Peripheral Component Interconnect express (PCie) interface standard.

16. The non-transitory computer readable medium claim 13, wherein the computing host comprises one or more of:
    a computer,
    a workstation computer,
    a server computer, a storage server,
a Personal Computer (PC),
a laptop computer,
a notebook computer,
a netbook computer,
a Personal Digital Assistant (PDA),
a media player,
a media recorder,
a digital camera,
a cellular handset,
a cordless telephone handset, and
an electronic game.

17. The non-transitory computer readable medium of claim 10, wherein the operations further comprise interfacing the flash memories.

18. The non-transitory computer readable medium of claim 17, wherein the interfacing is at least in part via a flash memory interface.

19. A system comprising:
one or more flash memories; and
a controller configured to allocate storage space of the one or more flash memories respectively to redundancy and data information;
wherein the one or more flash memories have a plurality of cells each enabled to store a plurality of bits, the bits of the cells organized into respective pages corresponding to read/write quanta of the flash memories; and
wherein the controller is enabled to configure respective ratios of redundancy and data information to each of the pages such that an effective error rate of a first one of the pages corresponding to a first one of the bits of a first one of the cells approaches an effective error rate of a second one of the pages corresponding to a second one of the bits of the first one of the cells.

20. The system of claim 19, wherein the effective error rates include effects of cross-decoding of the first and the second pages with respect to each other.

* * * * *